United States Patent
Byeon

(10) Patent No.: US 7,982,530 B2
(45) Date of Patent: Jul. 19, 2011

(54) INTERNAL VOLTAGE GENERATING APPARATUS AND METHOD FOR CONTROLLING THE SAME

(75) Inventor: Sang Jin Byeon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 51 days.

(21) Appl. No.: 12/494,437

(22) Filed: Jun. 30, 2009

(65) Prior Publication Data

US 2010/0237930 A1      Sep. 23, 2010

(30) Foreign Application Priority Data

Mar. 20, 2009   (KR) .................. 10-2009-0023838

(51) Int. Cl.
*G05F 1/10*     (2006.01)
(52) U.S. Cl. ....................................... 327/536
(58) Field of Classification Search .................. 327/535, 327/536, 537
See application file for complete search history.

(56) References Cited

U.S. PATENT DOCUMENTS

| | | | |
|---|---|---|---|
| 5,909,141 A * | 6/1999 | Tomishima | 327/536 |
| 6,373,753 B1 | 4/2002 | Proebsting | |
| 6,853,567 B2 | 2/2005 | Kwon | |
| 7,501,881 B2 * | 3/2009 | Youn et al. | 327/536 |
| 7,583,134 B2 * | 9/2009 | Kang | 327/536 |
| 7,724,072 B2 * | 5/2010 | Baek et al. | 327/536 |
| 2004/0208026 A1 | 10/2004 | Kwon | |
| 2004/0239409 A1 | 12/2004 | Jang et al. | |
| 2006/0097804 A1 | 5/2006 | Im et al. | |

FOREIGN PATENT DOCUMENTS

| | | |
|---|---|---|
| JP | 2003-030985 A | 1/2003 |
| JP | 2005-318034 A | 11/2005 |
| KR | 1020080053037 A | 6/2008 |

* cited by examiner

*Primary Examiner* — Jeffrey S Zweizig
(74) *Attorney, Agent, or Firm* — Ladas & Parry LLP

(57) ABSTRACT

The internal voltage generating apparatus includes a first charge pumping circuit, an external voltage level detector, and a second charge pumping circuit. The first charge pumping circuit outputs an internal voltage and selectively performs first charge pumping for the internal voltage depending on a result detecting a level of the internal voltage feedbacked. The external voltage level detector detects a level of an external voltage and outputs the result detecting the level of the internal voltage and outputs a result detecting the level of the external voltage as a detection signal. The second charge pumping circuit performs second charge pumping for the internal voltage together with the first charge pumping against a case in which the level of the external voltage is lower than a predetermined level by the detection signal of the external voltage level detector.

31 Claims, 7 Drawing Sheets

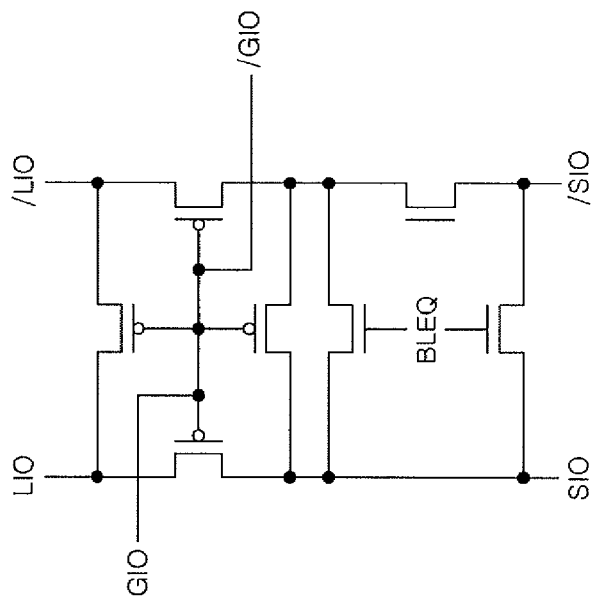
FIG.1C (PRIOR ART)
FIG.1B (PRIOR ART)
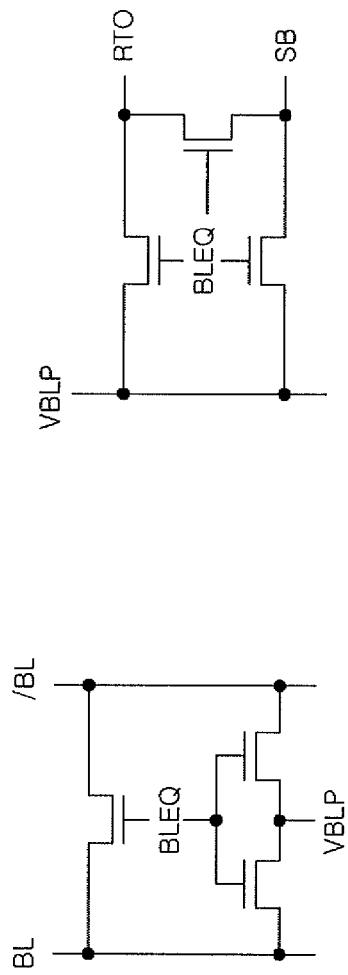
FIG.1A (PRIOR ART)

INTERNAL VOLTAGE GENERATING APPARATUS AND METHOD FOR CONTROLLING THE SAME

CROSS-REFERENCES TO RELATED PATENT APPLICATION

The present application claims priority under 35 U.S.C 119(a) to Korean Application No. 10-2009-0023838, filed on Mar. 20, 2009, in the Korean Intellectual Property Office, which is incorporated herein by reference in its entirety as set forth in full.

BACKGROUND

1. Technical Field

The embodiment described herein relates to a semiconductor technology and, more particularly, to an internal voltage generating apparatus that performs charge pumping at a is voltage level higher than an external voltage by adopting pumping circuits of two kinds or more.

2. Related Art

A DRAM, which is a semiconductor memory apparatus, generates internal voltages having various voltage levels by using an external voltage and the resultant internal voltages are used for internal operations of the DRAM for each respective purpose.

In the DRAM, a scheme of generating the internal voltage by using the external voltage is generally divided into two scenarios. One scheme of generating the internal voltage is by down-converting the external voltage to a low voltage level. The other scheme generates an internal voltage higher than a level of the external voltage or lower than a ground voltage by pumping the external voltage with a charge pump.

In general, the internal voltage generated by down-converting is used for reducing power consumption and the internal voltage generated by charge pumping is used for a special purpose.

The internal voltage most universally used among the internal voltages of the DRAM, which are generated by charge pumping includes a high voltage VPP and a back-bias voltage VBB.

The high voltage VPP is generated to have a voltage level higher than a power voltage VCC which is the external voltage so as to protect against cell data from being lost at a gate of a cell transistor (or word line) when accessing the cell data.

The back-bias voltage VBB is generated to have a voltage level lower than the ground voltage VSS, which is the external voltage in a bulk of the cell transistor, so as to protect against the loss of data stored in a cell.

Recently, the level of the external voltage of the semiconductor memory apparatus has been lowered to around 1.5V or below. As a result, it is difficult to ensure normal operations of a circuit with levels of the internal voltages used by down-converting the external voltage in order to reduce power in the conventional art.

An example in which the normal operation in the semiconductor memory apparatus is difficult to ensure will be described with reference to FIGS. 1A to 1C.

FIG. 1A illustrates a bit line sense amplifier (hereinafter, referred to as BLSA). In FIG. 1A, a bit line equalizing (hereinafter, referred to as BLEQ) transistor that equalizes a bit line (hereinafter, referred to as BL) and a bit line bar (hereinafter, referred to as /BL) is shown configured. The external voltage level or a voltage level lower than the external voltage level may be adopted in the BLEQ transistor as a pull-up voltage level for controlling a gate. However, in this case, the bit line BL and the bit line bar /BL cannot be normally equalized.

Further, a sense amplifier (hereinafter, referred to as SA) of FIG. 1B also cannot normally perform a precharge operation, before activating a pull-up transistor and a pull-down transistor, when a voltage level used as a pull-up source of a control signal of a transistor that precharges the pull-up and pull-down transistors to a level of a bit line precharge voltage 'VBLP' is used as the external voltage or the power voltage lower than the external voltage.

Further, in FIG. 1C, in the situation where a voltage level is used as a pull-up source of a gate of a transistor that precharges between signal lines SIO and /SIO and local input/output lines LIO and /LIO and between the local input/output lines LIO and /LIO and global input/output lines GIO and /GIO so that the voltage level uses the external voltage or the power voltage lower than the external voltage, then the precharge operation cannot also be normally performed.

As described above, with reference to FIGS. 1A to 1C, the reason why the precharge operation cannot be performed in the usual standard ways is that an NMOS transistor is difficult to transmit a high-level voltage of an input terminal because operating characteristics thereof to an output terminal. Also the NMOS transistor loses an electric potential as high as a threshold voltage 'vth' at a source thereof in the case when a gate potential is not higher than a drain potential by the threshold voltage 'vth' or more and a voltage of the source is applied to a drain.

One method for solving the above-mentioned problem is to use a double charge pump circuit shown in FIG. 2. The double charge pump circuit of FIG. 2 charge-pumps the high voltage VPP, which is the internal voltage to a voltage level higher than the voltage level of the external voltage, and uses the high voltage VPP as the pull-up source. The double charge pump circuit of FIG. 2 includes a VPP level detector 20, a ring oscillator 22, a pump control logic 24, and a doubler charge pump 26.

However, in the scheme of using the double charge pump of FIG. 2, since the efficiency of the charge pump with respect to the power voltage VCC of a low level is low, it then becomes difficult to pump the high voltage VPP which is the internal voltage to a predetermined voltage level or higher and as a result a large amount of current is consumed for pumping. Therefore, this scheme is disadvantageous in terms of current efficiency.

In order to solve the above problem in respects to current consumption, a circuit including the double charge pump and a triple charge pump may be used to generate the high voltage VPP as shown in FIG. 3. As shown in FIG. 3, the circuit of includes a VPP level detector 30, a ring oscillator 31, a pump control logic 32, a tripler charge pump 33, a ring oscillator 34, a pump control logic 35, and a doubler charge pump 36. The ring oscillator 31, the pump control logic 32 and the tripler charge pump 33 for triple pumping are connected to the ring oscillator 34, the pump control logic 35, and the doubler charge pump 36 are in parallel for double pumping. Among them, output terminals of the tripler charge pump 33 and the doubler charge pump 36 share a feed-back path to the VPP level detector 30.

The circuit of FIG. 3 can generate the requisite high voltage VPP at a high level by using the triple charge pump from the external voltage VCC of a low level. The circuit of FIG. 3 also realizes a number of advantages in terms of drivability and efficiency.

However, in situations when the triple charge pump is used in the external voltage VCC of a high level, then too much power is consumed. As a result a large peak-to-peak value is caused by a pumping operation, such that the circuit exhibits an analogical problem.

SUMMARY

A charge pump circuit that can generate a stable and efficient internal voltage by adjusting an enable timing in the case when a double charge pump and a triple charge pump are used together in order to form a high voltage VPP which is an internal voltage of a semiconductor memory apparatus is disclosed herein.

In one aspect, an internal voltage generating apparatus includes a first charge pumping circuit configured to output an internal voltage and selectively perform first charge pumping for the internal voltage depending on a result detecting a level of the internal voltage feed-backed, an external voltage level detector configured to detect a level of an external voltage and output the result detecting the level of the internal voltage and a result detecting the level of the external voltage as a detection signal and a second charge pumping circuit configured to perform second charge pumping for the internal voltage together with the first charge pumping against a case in which the level of the external voltage is lower than a predetermined level by the detection signal of the external voltage level detector.

In another aspect, an internal voltage generating apparatus includes a double charge pumping unit configured to output an internal voltage, compare a level of the internal voltage feed-backed with a first reference voltage, and selectively perform double charge pumping for the internal voltage depending on a comparison result and a triple charge pumping unit configured to perform triple charge pumping for the internal voltage against a case in which the pumping of the double charge pumping unit is performed and an external voltage is positioned at a domain having an voltage level lower than a second reference voltage.

In still another aspect, an internal voltage generating apparatus includes an external voltage level detector configured to compare an external voltage and a first reference voltage and output a comparison result as a first detection signal, an internal voltage level detector configured to compare an internal voltage feed-backed with a second reference voltage and output a comparison result as a second detection signal, a control circuit configured to combine outputs of the internal voltage level detector and the external voltage level detector and output an enable signal when both the internal voltage and the external voltage are within a charge pumping range, a double charge pumping unit configured to selectively perform double charge pumping for the internal voltage by the second detection signal of the internal voltage level detector and a triple charge pumping unit configured to selectively perform triple charge pumping for the internal voltage by the enable signal of the control circuit.

In still another aspect, a method for controlling an is internal voltage generating apparatus includes comparing an external voltage and a first reference voltage and outputting a comparison result as a first detection signal, feed-backing an internal voltage, comparing the internal voltage and a second reference voltage, and outputting a comparison result as a second detection signal, generating an enable signal when the levels of the internal voltage and the external voltage detected by the first and second detection signals are within a charge pumping range; selectively performing double charge pumping for the internal voltage by the second detection signal; and selectively performing triple charge pumping for the internal voltage by the enable signal.

These and other features, aspects, and embodiments are described below in the section "Detailed Description."

BRIEF DESCRIPTION OF THE DRAWINGS

Features, aspects, and embodiments are described in conjunction with the attached drawings, in which:

FIGS. 1A to 1C are diagrams illustrating a configuration of a precharge circuit in the conventional art;

DETAILED DESCRIPTION

Hereinafter, exemplary embodiments of the present invention will be described in detail. Accordingly, it is understood that the present invention is not limited to these particular exemplary embodiments disclosed below and that the present invention can be implemented in any number of various alternate forms which are too numerous to be discussed in detail. These present exemplary embodiments are provided for illustrative purposes to allow one skilled in the art to more easily grasp the essence of the present invention. A DRAM according to an embodiment of the present invention performs charge pumping for converting a power voltage VCC and a ground voltage VSS in which are external voltages to a voltage level higher than the power voltage VCC and a voltage level lower than the ground voltage VSS, respectively. Two kinds of charge pumps having different driving types are together used. An efficient and stable internal voltage is generated by adjusting an enable timing of the charge pumps together used when the level of a power voltage VCC which is the external voltage is low.

Figure 2:
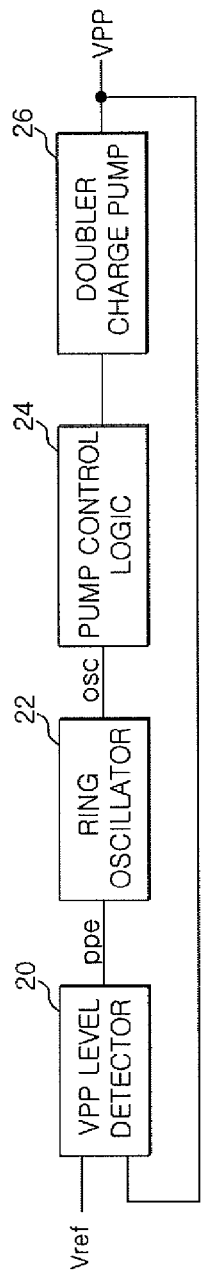
FIG. 2 is a diagram illustrating a configuration of a double charge pump in the conventional art.
Figure 3:
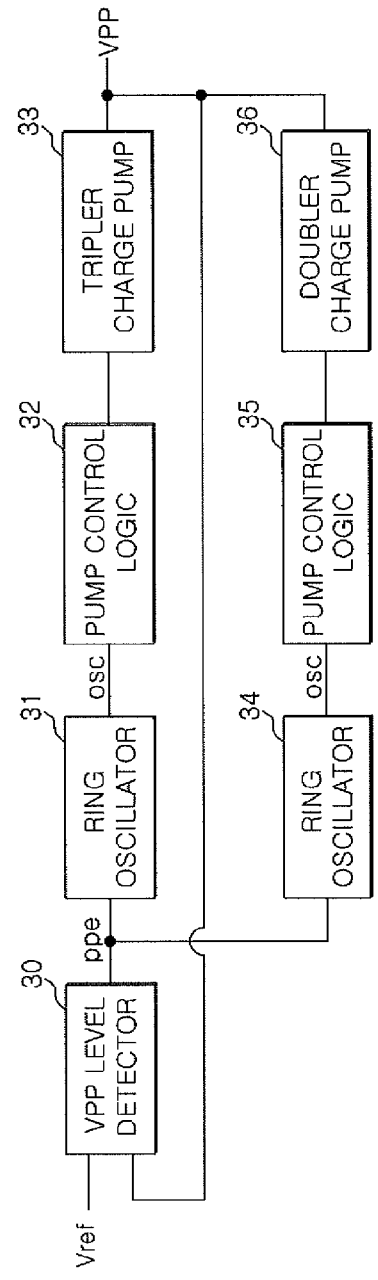
FIG. 3 is a diagram illustrating a configuration of a triple charge pump in the conventional art.
Figure 4:
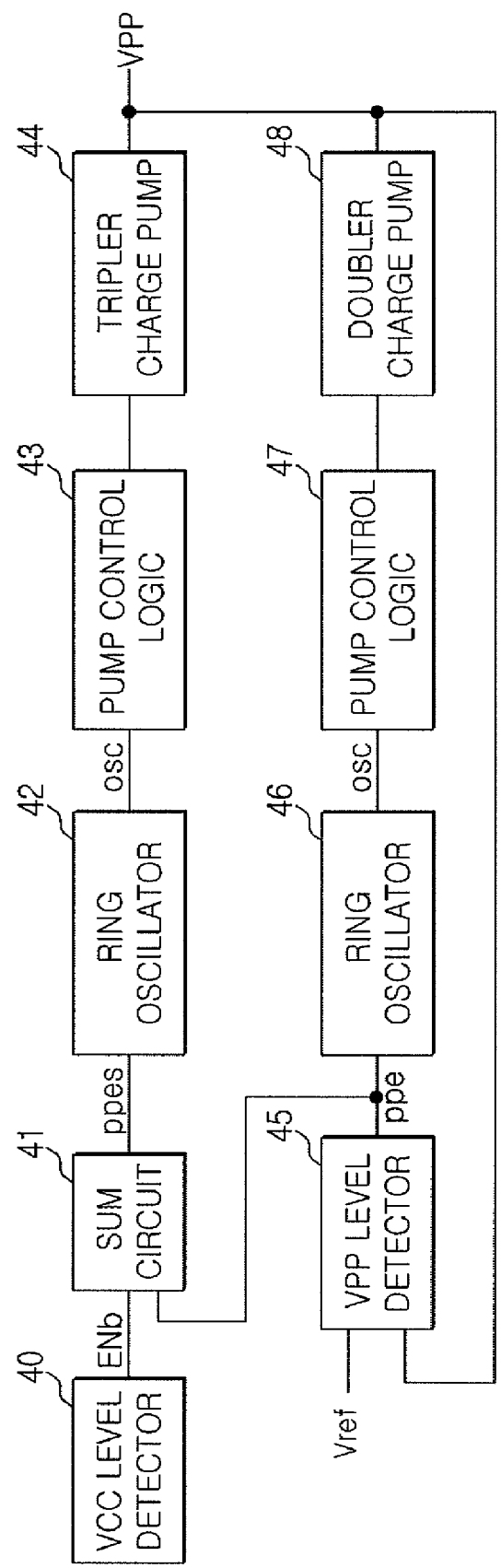
FIG. 4 is a block diagram schematically illustrating a configuration of an exemplary internal voltage generating apparatus according to one embodiment.

Referring to FIG. 4, an embodiment of the present invention includes both a doubler charge pump and a triple charge pump for pumping a high voltage VPP.

In FIG. 4, in this embodiment of the present invention an external voltage VCC level detector 40, a SUM circuit 41, a ring oscillator 42, a pump control logic 43, a tripler charge pump 44, an internal voltage VPP level detector 45, a ring oscillator 46, a pump control logic 47, and a doubler charge pump 48 can be included. This embodiment of the present invention can be generally sub classified into a double charge pump unit and a triple charge pump unit. The double charge pump unit includes the internal voltage VPP level detector 45, the ring oscillator 46, the pump control logic 47, and the doubler charge pump 48. The triple charge pump unit includes the ring oscillator 42, the pump control logic 43, and the tripler charge pump 44. The external voltage VCC level detector 40 and the SUM circuit 41 are used to control an operation of the triple charge pump unit.

Figure 5:
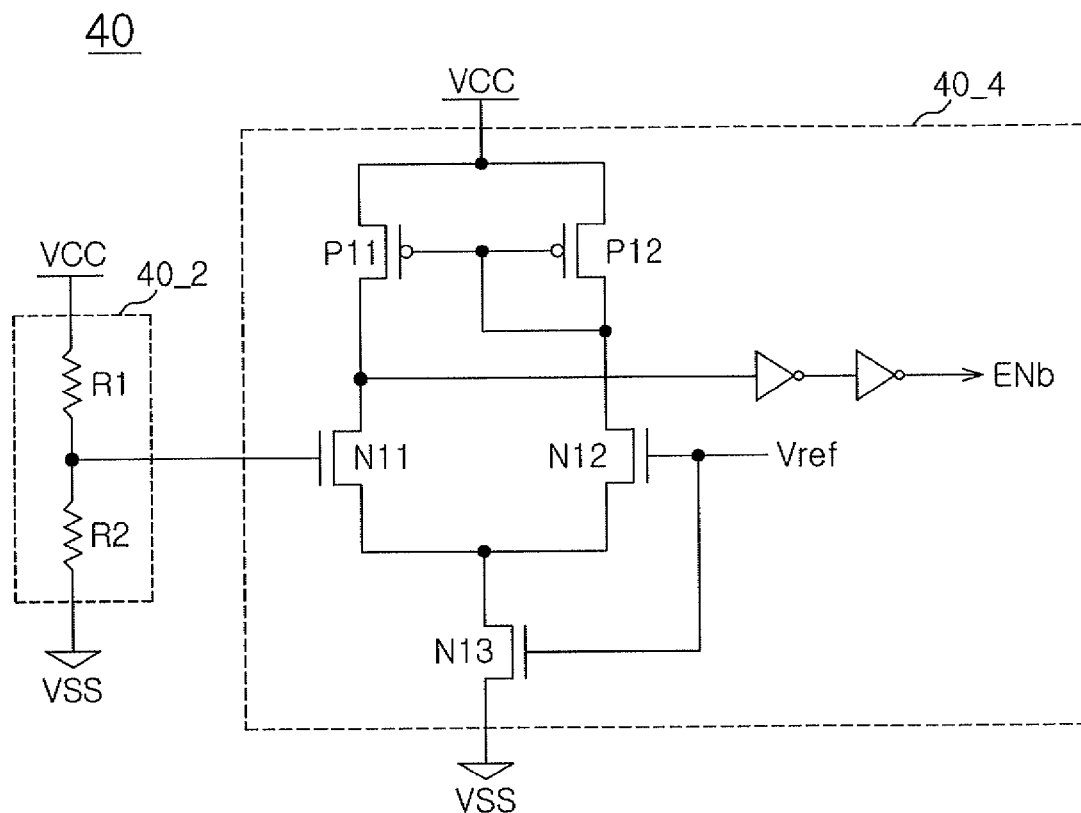
FIG. 5 is a schematic diagram of an exemplary VCC level detector of FIG. 4 according to one embodiment.

As shown in FIG. 5, the VCC level detector 40 can include a resistance section 40_2 and an output section 40_4. The resistance section 40_2 can have a configuration in which resistors R1 and R2 are connected in series between an external voltage VCC and a ground voltage VSS. The output section 40_4 can have a configuration in which PMOS transistors P11 and P12 and NMOS transistors N11 and N12.

The output section 40_4 can include an enabling NMOS transistor N13 which is operated by a reference voltage Vref. An output node of the resistance section 40_2 is shown connected to a gate of the NMOS transistor N11 and the reference voltage Vref is shown applied to a gate of the NMOS transistor N12. Therefore, the VCC level detector 40 can compare the level of the external voltage VCC detected in the resistance section 40_2 with the reference voltage Vref and subsequently output an enable signal 'ENb' as either a high level or a low level depending on the comparison result.

Figure 6:
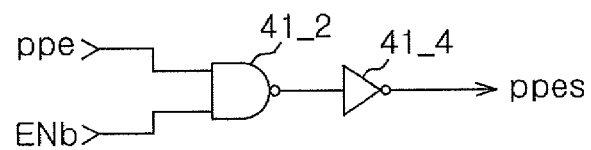
FIG. 6 is a diagram illustrating a configuration of an exemplary SUM circuit of FIG. 4 according to one embodiment.
Figure 7:
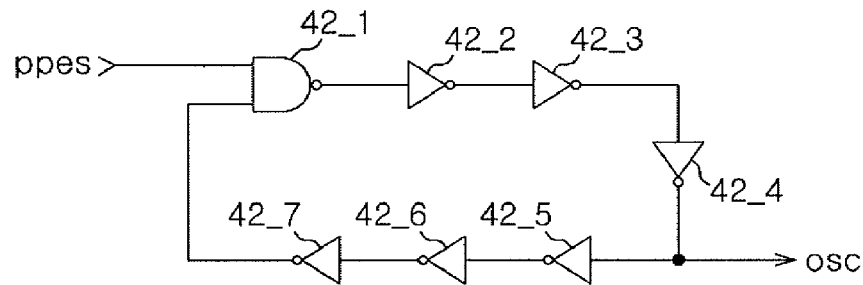
FIG. 7 is a diagram illustrating a configuration of an exemplary ring oscillator of FIG. 4 according to one embodiment.

As shown in FIG. 6, the SUM circuit 41 can include a NAND gate 41_2 and an inverter 41_4. The SUM circuit 41 is configured to output a detection signal 'ppes' for determining whether or not the triple charge pump unit is driven by NANDing together the enable signal 'ENb' and a detection signal 'ppe' through the NAND gate 41_2 and subsequently through the inventer 41_4 which outputs the detection signal 'ppes'. When the level of the external voltage VCC is low, the outputted detection signal 'ppes' which is disabled and when the level of the external voltage VCC is high, the outputted detection signal 'ppes' which is enabled.

The activation timing of the triple charge pump unit is controlled by the detection signal 'ppes'. The triple charge pump unit can include the ring oscillator 42, the pump control logic 43, and the tripler charge pump 44. The triple charge pumping unit can perform pumping when the level of the external voltage VCC is high.

As shown in FIG. 71 the ring oscillator 42 can also be included in the NAND gate 42_1 in which the detection signal 'ppes' is inputted so as to oscillate the detection signal 'ppes' through the plurality of inverters 42_2 to 42_7, that form a closed loop together with the NAND gate 42-1, to output an oscillation signal 'OSC'.

Figure 8:
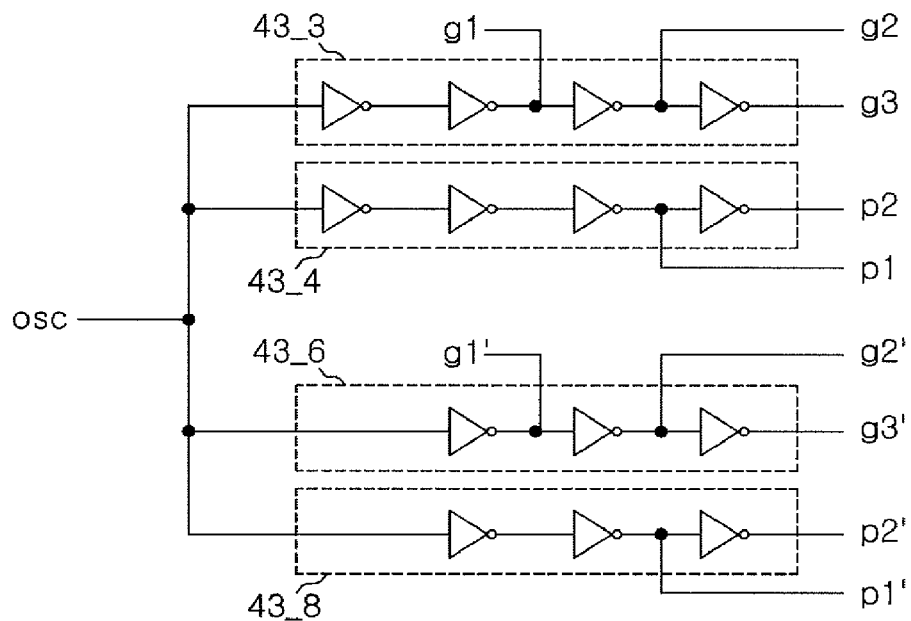
FIG. 8 is a diagram illustrating a configuration of an exemplary pump control logic of FIG. 4 according to one embodiment.

As shown in FIG. 8, the pump control logic 43 can include a pair of 4-step inverter chains 43_2 and 43_4 in which the oscillation signal OSC is inputted and include a pair of 3-step inverter chains 43_6 and 43_8. As shown in FIG. 8, the control signals 'g1', 'g2', 'g3', 'p1', and 'p2' are outputted from output terminals along the pair of 4-step inverter chains 43_2 and 43_4 and a terminal thereof. Also as shown in FIG. 8, and control signals 'g1", 'g2", 'g3", 'p1", and 'p2" are outputted from output terminals of the pair of 3-step inverter chains 43_6 and 43_8 and a terminal thereof.

Figure 9:
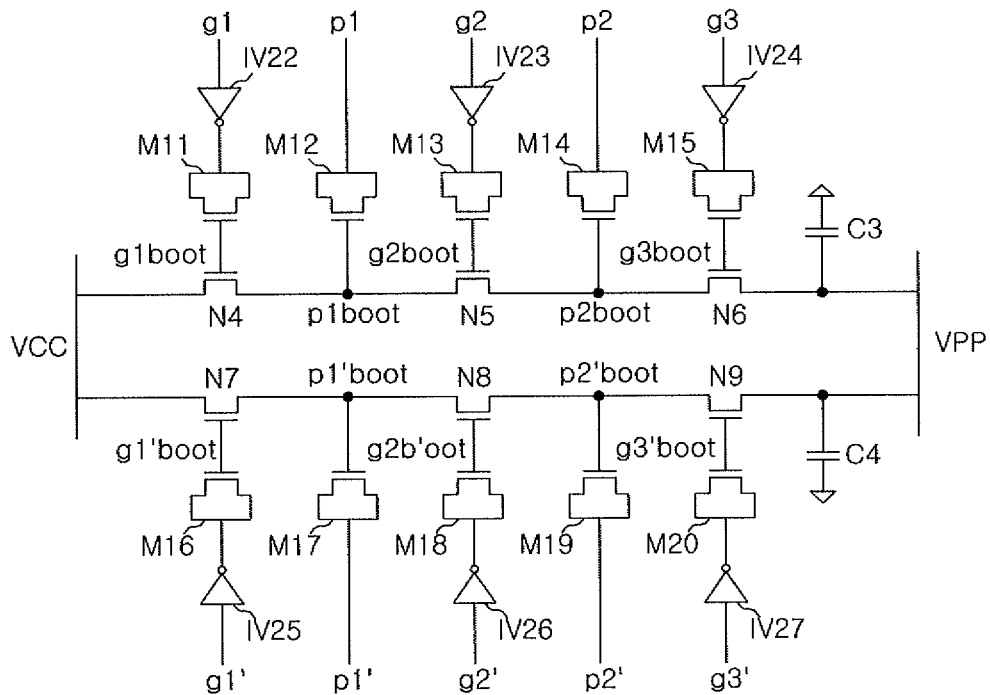
FIG. 9 is a diagram illustrating a configuration of an exemplary tripler charge pump of FIG. 4 according to one embodiment.

One example of how the tripler charge pump 44 can be configured is shown in FIG. 9. The tripler charge pump of FIG. 9 which is provided as just one of the various numerous examples shows that the tripler charge pump 44 can be composed by a series array of NMOS transistors N4, N5, and N6 and another series of array of NMOS transistors N7, N8, and N9 that are both connected between the external voltage VCC and the internal voltage VPP. The control signals 'g1', 'g2', 'g3', 'g1", 'g2", and 'g3" are applied to gates of the NMOS transistors N4, N5, N6, N7, N8, and N9 through NMOS capacitors and inverters <M11, IV22>, <M13, IV23>, <M15, IV24>, <M16, IV25>, <M18, IV26>, and <M20, IV27>. The control signals 'p1', 'p2', 'p1", and 'p2" are applied to nodes among the NMOS transistors N4, N5, N6, N7, N8, and N9 through NMOS capacitors M12, M14, M17, and M19. Capacitors C3 and C4 are configured in parallel at a terminal of each array to which the internal voltage VPP is applied. Boosting occurs for each node of each array, such that the tripler charge pump 44 performs triple charge pumping.

Figure 10:
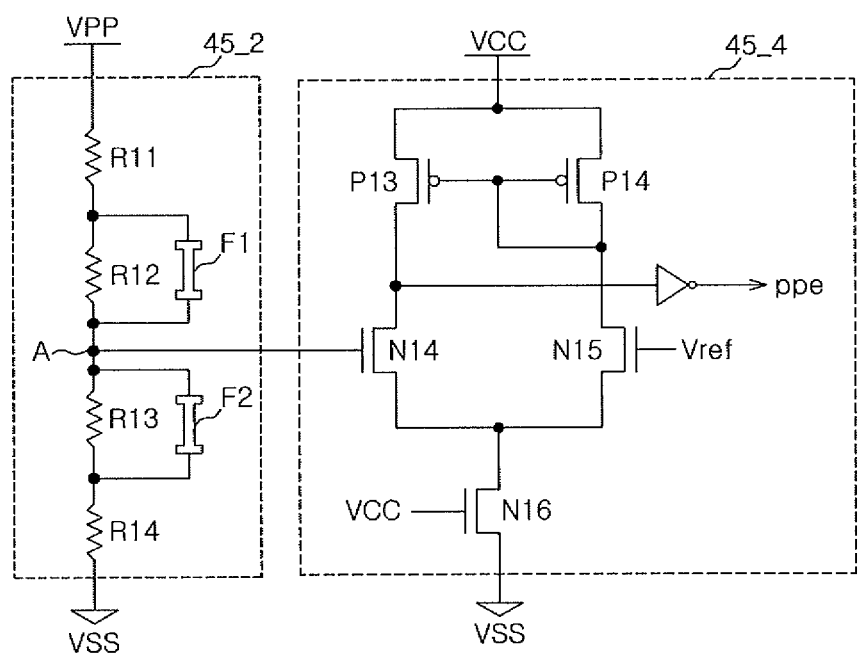
FIG. 10 is a diagram illustrating a configuration of an exemplary VPP level detector of FIG. 4 according to one embodiment.

One exemplary configuration of the internal voltage VPP level detector 45 is shown in FIG. 10. The internal voltage VPP level detector 45 is shown having the ring oscillator 46, the pump control logic 47, and the doubler charge pump 48 that constitute the doubler charge pump unit will be described below. The internal voltage VCC level detector 45 can include a resistance section 45_2 having a configuration in which resistors R11, R12, R13, and R14 are connected in series between the internal voltage VPP and the ground voltage VSS. The internal voltage VCC level detector 45 also can include an output section 45_4 in which PMOS transistors P13 and P14 and NMOS transistors N14 and N15.

As shown in FIG. 10, the resistance section 45_2 can use active resistors. The number of resistors can be used for controlling an accurate trimming. Fuses F1 and F2 can be used for controlling a detection level in which the fuses F1 and F2 can be configured in parallel with some of the resistors of the resistance section 45_2. The output section 45_4 can include an enabling NMOS transistor N16 which is operated with the external voltage VCC at the gate of the enabling NMOS transistor N16. An output node A of the resistance section 45_2 is shown connected to a gate of the NMOS transistor N14 and the reference voltage Vref is shown applied to a gate of the NMOS transistor N15. Therefore, the internal voltage VPP level detector 45 can compare the level of the internal voltage VPP detected in the resistance section 45_2 with a reference voltage Vref and subsequently output an enable signal 'ppe' at either a high level or a low level depending on the comparison result to inform where the VPP is present.

The ring oscillator 46 of FIG. 4 is shown operated by the enable signal 'ppe' to output the oscillation signal 'OSC'. Since a detailed configuration of the ring oscillator 46 can be referenced with the ring oscillator 42, a description thereof will be omitted.

Figure 11:
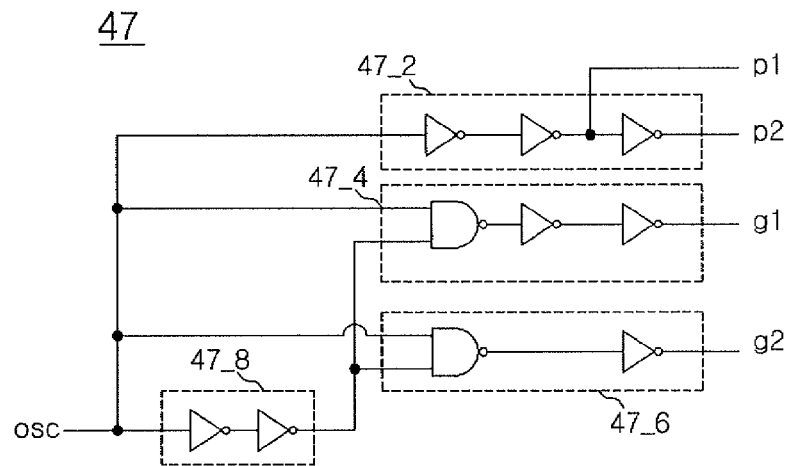
FIG. 11 is a diagram illustrating a configuration of an exemplary pump control logic of FIG. 4 according to one embodiment.

As shown in FIG. 11, the pump control logic 47 can be configured to include a first array 47_2 that comprises three in series inverters, a second array 47_4 that comprises one NAND gate and two in series inverters, a third array 47_6 that comprises one NAND gate and one inverter, and a buffer 47_8 that comprises two in series inverters. The buffer 47_8 provides the oscillation signal 'OSC' to the second and third arrays 47_4 and 47_6. Each array receives the oscillation signal 'OSC'.

In the case of the first array 47_2, the control signals 'P1' and 'P2' are shown outputted from a last inverter and a prior terminal thereof, respectively. In the case of the second array 47_4, the control signal 'g1' is shown outputted from a last inverter. In the case of the third array 47_6, the control signal 'g2' is shown outputted from a last inverter.

Figure 12:
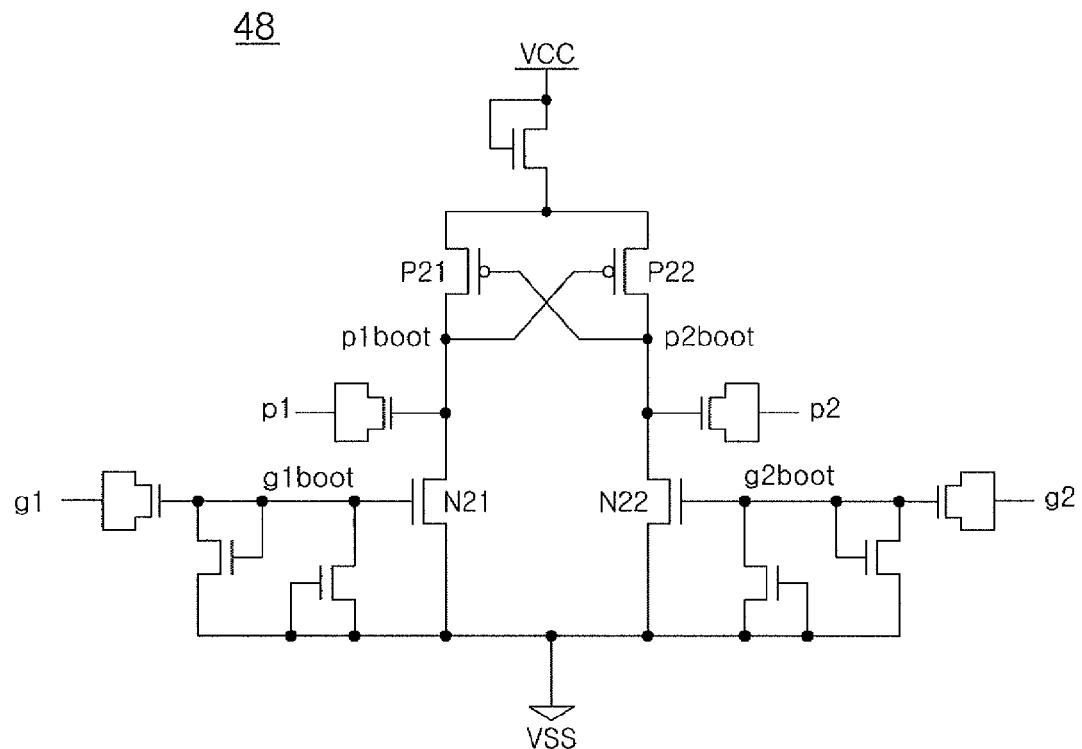
FIG. 12 is a diagram illustrating a configuration of an exemplary doubler charge pump of FIG. 4 according to one embodiment.

In FIG. 12, in the doubler charge pump 48, PMOS transistors P21 and P22 are shown cross-coupled with each other and the doubler charge pump 48 is constituted by a differential amplifier adopting driving NMOS transistors N21 and N22 The control signal 'p1' is shown transmitted to a node between the PMOS transistor P21 and the NMOS transistor N21. The control signal P2 is shown transmitted to a node between the PMOS transistor P22 and the NMOS transistor N22. The control signal 'g1' is shown transmitted to a gate of the NMOS transistor N21. The control signal 'g2' is shown transmitted to a gate of the NMOS transistor N22.

An operation of the embodiment of the present invention will be described below.

<Double Charge Pump>

The VPP level detector 45 is configured to detect a level of a high voltage VPR The ring oscillator 46 is configured to generate a periodic signal as an output signal 'ppe' of the VPP level detector. The pump control logic 47 is configured to generate a signal for controlling the doubler charge pump 48 by using an output signal 'OSC' of the ring oscillator. The doubler charge pump 48 is configured to pump the high voltage VPP by using the control signal of the pump control logic 47.

The VPP level detector 45 receives the reference voltage Vref in order to generate the high voltage VPP and subsequently detects the level of the high-level VPP by comparing the level of the high voltage VPP feed-backed with the reference voltage Vref.

That is, when the level of the high voltage VPP is lower than a desired target level, the level of the node A which is one node of resistors connected with each other in series, which is applied with the high voltage VPP through feed-back is lower than the reference voltage Vref. As a result, the output signal 'ppe' is outputted at a high level. In addition, when the high voltage VPP is higher than the desired target level, the level of the node A which is one node of the resistors connected with each other in series, which is applied with the high voltage VPP through feed-back is higher than the reference voltage Vref. As a result, the output signal 'ppe' is outputted at a low level.

In the situation when the target level of the high voltage VPP needs to be adjusted by being either increased or decreased, then resistance ratios of both terminals of the node A can be made different from each other by cutting the fuses F1 and F2 that are connected to each resistors in parallel. As a result the target level of the high voltage VPP may be adjusted.

The output signal 'ppe' of the VPP level detector 45 is a signal to allow the ring oscillator 46 to be operated. When the output signal 'ppe' is at a high level, then the ring oscillator 46 is operated.

When the ring oscillator 46 is operated, signals 'p1', 'p2', 'g1', and 'g2' having different timings are generated by the pump control logic 47. The control signals outputted from the pump control logic 47 are inputted into the doubler charge pump 48 to control a pumping operation and increase the level of the high voltage VPP.

Thereafter, when the pumping operation is continuous and the high voltage VPP reaches the target level, then the output signal 'ppe' of the high voltage VPP level detector 45 transitions to a low level and as a result, the pumping operation is stopped.

A charge pumped by a series of operations is stored in a capacitor that is installed between the high voltage VPP and a power voltage VCC. The charge maintains a relatively constant level and is used to drive a word line.

If the charge stored in the capacitor is consumed by driving the word line, the level of the high voltage VPP decreases. The VPP level detector 45 subsequently detects the decrease of the level and controls the pumping operation by transitioning the output signal 'ppe' back into a high level again.

When the control signals 'p1', 'p2', 'g1', and 'g2' generated by the pumping control logic 47 are inputted into the doubler charge pump 48, a capacitor p1boot is bootstrapped and transitioned from VCC to 2 VCC while the control signal 'p1' is transitioned from the ground voltage VSS to the power voltage VCC. At this time, the control signal 'p2' is transitioned from the power voltage VCC to the ground voltage VSS, such that a capacitor p2boot is bootstrapped and transitioned from 2 VCC to VCC.

By this configuration, a charge of the capacitor p1boot, which has the level of 2 VCC flows to a VPP terminal through the transistor P21. The capacitor p1boot and the VPP terminal share the charge for a predetermined time and reach an equilibrium state.

Thereafter, when the control signal 'g2' is transitioned from VSS to VCC and thus a capacitor g2boot is bootstrapped and transitioned from VCC to 2 VCC, a transistor N2 is turned on and the capacitor p2boot is precharged with VCC. Then, when the control signal 'g2' is again transitioned from VCC to VSS and the capacitor g2boot is at VCC, such that the transistor N2 is turned off and precharged. At this time, the control signal p1 is transitioned from VCC to VSS, such that the capacitor p1boot is at VCC and the control signal p2 is transitioned from VSS to VCC, such that the capacitor p2boot is at 2 VCC. In this case, the capacitor p2 boot and the VPP terminal share the charge through a transfer transistor P22.

As a predetermined time elapsed, when the capacitor p2boot and the VPP terminal share the charge and reach the equilibrium state, then the control signal 'g1' is transitioned from VSS to VCC and thus the capacitor g1boot is bootstrapped and transitioned from VCC to 2 VCC. At his time, the transistor N21 is turned on and thus the capacitor p1boot is precharged with VCC. Thereafter, the control signal 'g1' is again transitioned from VCC to VSS and thus the capacitor g1boot is at VCC. At this time, the transistor N21 is turned off and thus the precharge is completed. Therefore a next operation is prepared.

In general, current efficiency of the doubler VPP charge pump can be estimated to be (2 VCC−VPP)*C/2 VCC*C*100 (herein, C is capacitance of the capacitor p1boot and p2boot). The theoretical maximum pumpable level of the high voltage VPP is at 2 VCC. For example, when VCC=1.5 v and the VPP target level is 3 v, the current efficiency is 0% and when the VPP target level is 2.0 v, the current efficiency is approximately 33%. Under these conditions the theoretical maximum pumpable level of the high voltage VPP is at 3 v. Herein, the current efficiency is a value acquired by dividing an amount of the charge stored in the high voltage VPP by an amount of a charge supplied from an operation voltage VCC.

<Triple Charge Pump>

The VCC level detector 40 can detect a level of an external voltage VCC and the VPP level detector 45 can detect the level of the high voltage VPR.

The SUM circuit 41 is used to control an operation of the triple charge pump. The SUM circuit 41 is configured to generate the control signal 'ppes' by combining signals detecting the level of the external voltage VCC and the level of the internal voltage VPP, that is, 'ENb' and 'ppe' and control an activation timing of the tripler charge pump by using the control signal 'ppes' as an enable signal for triple charge pumping.

That is, in the case when the power voltage VCC which is the external voltage is at a low-voltage state, then the triple charge pump is driven together with the double charge pump. In the case when the power voltage VCC which is the external voltage is at a high-voltage state, then only the double charge pump is driven.

The ring oscillator 42 is configured to generate a periodic signal as the output signal 'ppes' of the SUM circuit 41. The pump control logic 43 can generate a signal for controlling the tripler charge pump 44 by using the output signal 'OSC' of the ring oscillator 42. The tripler charge pump 44 can pump the high voltage VPP by using the output signal of the pump control logic.

The operations of the tripler VPP charge pump and the doubler VPP charge pump are different in regard to the pump control logic and the charge pump. The same operation of the tripler VPP charge pump as the doubler VPP charge pump will not be repetitively described.

The control signals are outputted from the pump control logic 43. The control signals 'g1"', 'g2"', 'g3"', 'p1'', and 'p2"' have the same timing as and have an opposite phase to the control signals 'g1'', 'g2'', 'g3'', 'p1'', and 'p2''. The signals of the two groups are inputted into the tripler VPP charge pump 44 to generate the high voltage VPP.

The control signal 'g1' is transitioned from VSS to VCC to turn on the transistor N4. At this time, when the control signal 'p1' is transitioned from VCC to VSS and thus the capacitor p1boot is at 2 VCC, the capacitor p1boot is precharged with VCC.

Thereafter, the control signal 'g1' is transitioned from VCC to VSS to turn off the transistor N4. At this time, when the control signal 'p1' is transitioned from VSS to VCC and thus the capacitor p1boot is at 2 VCC, then the control signal 'g2' is transitioned from VSS to VCC to turn on a transistor N5. At this time, the control signal 'p2' is transitioned from VCC to VSS, such that the capacitor p2boot is at 2 VCC. Thereafter, the capacitor p2boot is at VCC with being precharged together with the capacitor p1boot.

The control signal 'g2' is transitioned from VCC to VSS to turn off the transistor N5 and the control signal 'p2' is again transitioned from VSS to VCC, so that the capacitor p2boot is at 2 VCC.

Lastly, when the control signal 'g3' is transitioned from VSS to VCC to turn on a transistor N6, then the high voltage VPP and the capacitor p2boot which is at 2 VCC share the charge. By a series of operations, the capacitor p1boot can perform charge pumping to 2 VCC up to the maximum and the capacitor p2boot can perform charge pumping up to 3 VCC.

The control signals 'g1"', 'g2"', 'g3"', 'p1'', and 'p2"' have the opposite phase to the control signals 'g1'', 'g2'', 'g3'', 'p1'', and 'p2'' and control pumping in the same manner as above. That is, the tripler VPP charge pumps that are cross-coupled with each other alternately supply the charge to the high voltage VPP.

In general, current efficiency of the tripler VPP charge pump can be expressed as (3 VCC−VPP)*C/5 VCC*C)*100 (herein, C is capacitance of the capacitor p1boot and p1'boot and capacitance of p2boot and p2'boot). Accordingly, the theoretical maximum pumpable level of the high voltage VPP is at 3 VCC. For example, when VCC=1.5 v and the high voltage VPP target level is 3.0 v, then the current efficiency is 20% and when the high-level VPP target level is 2.0 v, then the current efficiency is 33%. Under these conditions, the theoretical maximum pumpable level of the high voltage VPP is at 4.5 v. Herein, the current efficiency is a value acquired by dividing an amount of a charge stored in the high voltage VPP by an amount of a charge supplied from an operation voltage VCC.

By the above-mentioned configuration, according to the present invention, the level of the external voltage VCC is detected by using the external voltage VCC detector 40 and the level of the internal voltage VPP is detected by using the internal voltage VPP detector 45 and double charge pumping is performed depending on the level of the internal voltage VPP and triple charge pumping is performed together with the double charge pumping depending on the level of the external voltage VCC. That is, in the present invention, it is possible to control the activation timing of the tripler charge pump 44 depending on the level of the external voltage VCC.

Therefore, in the situation when the power voltage VCC which is the external voltage is at a low-voltage state, then the triple charge pump is driven together with the double charge pump. In the situation when the power voltage VCC which is the external voltage is at a high-voltage state, then only the double charge pump is driven. Accordingly, the high voltage VPP effectively reaches a target voltage level while the power voltage VCC is at a low-voltage state and when the power voltage VCC is at a high-voltage state, power consumption decreases, thereby ensuring the stable internal voltage.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. An internal voltage generating apparatus, comprising:
   a first charge pumping circuit configured to output an internal voltage and selectively perform first charge pumping of the internal voltage depending on a detected result of a level of the internal voltage feed-backed;
   an external voltage level detector configured to detect a level of an external voltage and to output the detected result of the level of the internal voltage and a detected result of the level of the external voltage as a detection signal; and
   a second charge pumping circuit configured to perform second charge pumping for the internal voltage together with the first charge pumping when the level of the external voltage is lower than a predetermined level by the detection signal of the external voltage level detector.

2. The internal voltage generating apparatus according to claim 1, wherein the first charge pumping circuit includes:
   an internal voltage level detector configured to detect the level of the internal voltage;
   a ring oscillator configured to selectively perform oscillation depending on the detected result of the internal voltage level detector;
   a pump control logic configured to generate a control signal in response to a pulse oscillated and outputted from the ring oscillator; and
   a doubler charge pump configured to output the internal voltage by performing double charge pumping in response to the control signal provided from the pump control logic.

3. The internal voltage generating apparatus according to claim 2, wherein the internal voltage level detector includes:
   a resistance section configured to output a divided portion of the internal voltage; and
   an output section configured to compare an output of the resistance section with a second reference voltage and to output a detection signal corresponding to a comparison result.

4. The internal voltage generating apparatus according to claim 3, wherein the resistance section comprises a resistor string and a fuse which is connected to at least one resistor in parallel.

5. The internal voltage generating apparatus according to claim 1, wherein the external voltage level detector includes:
  an external voltage level detector configured to detect the level of the external voltage; and
  a SUM circuit configured to combine an output of the external voltage level detector with the detected result detecting of the internal voltage and enable the detection signal when the first charge pumping circuit is enabled and the external voltage is lower than the predetermined level.

6. The internal voltage generating apparatus according to claim 5, wherein the external voltage level detector includes:
  a resistance section configured to output a divided portion of the external voltage; and
  an output section configured to compare the output of the resistance section with a predetermined reference voltage and to output a signal corresponding to a comparison result.

7. The internal voltage generating apparatus according to claim 6, wherein the resistance section comprises resistors.

8. The internal voltage generating apparatus according to claim 1, wherein the second charge pumping circuit includes:
  a ring oscillator configured to selectively perform oscillation depending on the output of the external voltage level detector;
  a pump control logic configured to generate the control signal in response to an oscillation signal outputted from the ring oscillator; and
  a tripler charge pump configured to output the internal voltage by performing triple charge pumping in response to the control signal provided from the pump control logic.

9. The internal voltage generating apparatus according to claim 1, wherein the internal voltage is a high voltage VPP.

10. The internal voltage generating apparatus according to claim 1, wherein the second charge pumping circuit performs pumping by setting a higher voltage level than the first charge pumping circuit as a target value.

11. An internal voltage generating apparatus, comprising:
  a double charge pumping unit configured to output an internal voltage, to compare a level of the internal voltage feed-backed with a first reference voltage, and to selectively perform double charge pumping for the internal voltage depending on a comparison result; and
  a triple charge pumping unit configured to perform triple charge pumping for the internal voltage against a case in which the pumping of the double charge pumping unit is performed and an external voltage is positioned at a domain having a voltage level lower than a second reference voltage.

12. The internal voltage generating apparatus according to claim 11, wherein the double charge pumping unit comprises:
  an internal voltage level detector configured to compare the level of the internal voltage with the first reference voltage and to detect the comparison result;
  a ring oscillator configured to selectively perform oscillation depending on a detection result of the internal voltage level detector;
  a pump control logic configured to generate a control signal by a pulse oscillated and outputted from the ring oscillator; and
  a doubler charge pump configured to output the internal voltage by performing double charge pumping by the control signal provided from the pump control logic.

13. The internal voltage generating apparatus according to claim 12, wherein the internal voltage level detector comprises:
  a resistance section configured to output a divided portion of the internal voltage; and
  an output section configured to compare an output of the resistance section with the first reference voltage and to output a detection signal corresponding to a comparison result.

14. The internal voltage generating apparatus according to claim 13, wherein the resistance section comprises a resistor string and a fuse which is connected to at least one resistor in parallel.

15. The internal voltage generating apparatus according to claim 11, wherein the triple charge pumping unit comprises:
  a control circuit configured to output an enable signal when the charge pumping of the double charge pumping unit is performed and the external voltage is positioned at the domain having the voltage level lower than the second reference voltage;
  a ring oscillator configured to selectively perform oscillation in response to the enable signal of the control circuit;
  a pump control logic configured to generate the control signal in response to an oscillation signal outputted from the ring oscillator; and
  a tripler charge pump configured to output the internal voltage by performing triple charge pumping in response to the control signal provided from the pump control logic.

16. The internal voltage generating apparatus according to claim 15, wherein the control circuit includes:
  an external voltage level detector configured to detect the level of the external voltage; and
  a SUM circuit configured to combine an output of the external voltage level detector with the result detecting the level of the internal voltage and to output the detection signal at an enable state against an enable state of the double charge pumping unit when the external voltage is lower than the predetermined level.

17. The internal voltage generating apparatus according to claim 16, wherein the external voltage level detector comprises:
  a resistance section comprising a resistor string that outputs and divides a portion of the internal voltage; and
  a comparator configured to compare an output of the resistance section with the second reference voltage and to output a detection signal corresponding to a comparison result.

18. The internal voltage generating apparatus according to claim 16, wherein the SUM circuit includes:
  a NAND gate configured to logically sum a signal for pumping of the double charge pumping unit and an output of the comparator; and
  an inverter configured to invert an output of the NAND gate.

19. The internal voltage generating apparatus according to claim 11, wherein the internal voltage is a high voltage VPP.

20. The internal voltage generating apparatus according to claim 11, wherein the triple charge pumping unit performs pumping by setting a higher voltage level than the double charge pumping unit as a target value.

21. An internal voltage generating apparatus, comprising:
  an external voltage level detector configured to compare an external voltage with a first reference voltage and to output a comparison result as a first detection signal;
  an internal voltage level detector configured to compare an internal voltage feed-backed with a second reference voltage and to output a comparison result as a second detection signal;

a control circuit configured to combine outputs of the internal voltage level detector and the external voltage level detector and to output an enable signal when both the internal voltage and the external voltage are within a charge pumping range;

a double charge pumping unit configured to selectively perform double charge pumping for the internal voltage by the second detection signal of the internal voltage level detector; and a triple charge pumping unit configured to selectively perform triple charge pumping for the internal voltage by the enable signal of the control circuit.

22. The internal voltage generating apparatus according to claim 21, wherein the external voltage level detector comprises:

a resistance section configured to output a divided portion of is the external voltage; and an output section configured to compare an output of the resistance section with the first reference voltage and to output the first detection signal corresponding to a comparison result.

23. The internal voltage generating apparatus according to claim 22, wherein the resistance section comprises a string of resistors.

24. The internal voltage generating apparatus according to claim 21, wherein the internal voltage level detector comprises:

a resistance section configured to output a divided portion of the internal voltage; and a comparator configured to compare an output of the resistance section with the second reference voltage and to output the second detection signal corresponding to a comparison result.

25. The internal voltage generating apparatus according to claim 24, wherein the resistance section comprises a resistor string and a fuse connected to at least one resistor in parallel.

26. The internal voltage generating apparatus according to claim 21, wherein the control circuit includes:

a NAND gate configured to NAND-combine outputs of the internal voltage level detector and the external voltage level detector; and an inverter configured to invert an output of the NAND gate.

27. The internal voltage generating apparatus according to claim 21, wherein the double charge pumping unit includes:

a ring oscillator configured to selectively perform oscillation depending on the second detection signal of the internal voltage level detector;

a pump control logic configured to generate a control signal in response to a pulse oscillated and outputted from the ring oscillator; and a doubler charge pump configured to output the internal voltage by performing double charge pumping in response to the control signal provided from the pump control logic.

28. The internal voltage generating apparatus according to claim 21, wherein the triple charge pumping unit includes:

a ring oscillator configured to selectively perform the oscillation depending on the enable signal of the control circuit;

a pump control logic configured to generate the control signal in lo response to the pulse oscillated and outputted from the ring oscillator; and a tripler charge pump configured to output the internal voltage by performing triple charge pumping in response to the control signal provided from the pump control logic.

29. The internal voltage generating apparatus according to claim 21, wherein the internal voltage is a high voltage VPP.

30. The internal voltage generating apparatus according to claim 21, wherein the triple charge pumping unit performs pumping by setting a higher voltage level than the double charge pumping unit as a target value.

31. A method for controlling an internal voltage generating apparatus, comprising:

comparing an external voltage with a first reference voltage and outputting a comparison result as a first detection signal;

feed-backing an internal voltage, comparing the internal voltage with a second reference voltage, and outputting a comparison result as a second detection signal;

generating an enable signal when the levels of the internal voltage and the external voltage detected by the first and second detection signals are within a charge pumping range;

selectively performing double charge pumping for the internal voltage by the second detection signal; and selectively performing triple charge pumping for the internal voltage by the enable signal.

* * * * *